United States Patent
Ohhashi et al.

(10) Patent No.: US 8,255,668 B2
(45) Date of Patent: Aug. 28, 2012

(54) INTERFACE, MEMORY SYSTEM, AND ACCESS CONTROL METHOD

(75) Inventors: Shinya Ohhashi, Kasugai (JP); Satoshi Takashima, Kasugai (JP); Akihiro Miki, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 276 days.

(21) Appl. No.: 12/692,234

(22) Filed: Jan. 22, 2010

(65) Prior Publication Data
US 2010/0250872 A1 Sep. 30, 2010

(30) Foreign Application Priority Data
Mar. 30, 2009 (JP) .................................. 2009-82881

(51) Int. Cl.
*G06F 12/02* (2006.01)
(52) U.S. Cl. ................. 711/219; 711/167; 711/E12.002
(58) Field of Classification Search ......................... None
See application file for complete search history.

(56) References Cited

U.S. PATENT DOCUMENTS

| | | | | |
|---|---|---|---|---|
| 5,511,033 A | * | 4/1996 | Jung | 365/222 |
| 5,577,218 A | * | 11/1996 | Hamaguchi | 711/5 |
| 5,659,515 A | * | 8/1997 | Matsuo et al. | 365/222 |
| 6,438,055 B1 | * | 8/2002 | Taguchi et al. | 365/222 |
| 6,487,135 B2 | | 11/2002 | Watanabe et al. | |
| 6,671,210 B2 | | 12/2003 | Watanabe et al. | |
| 6,707,743 B2 | * | 3/2004 | Leung et al. | 365/222 |
| 7,016,246 B2 | | 3/2006 | Watanabe et al. | |
| 2002/0051397 A1 | | 5/2002 | Watanabe et al. | |
| 2003/0026158 A1 | | 2/2003 | Knall et al. | |
| 2003/0067456 A1 | * | 4/2003 | Low et al. | 345/204 |
| 2004/0090857 A1 | | 5/2004 | Watanabe et al. | |
| 2005/0180243 A1 | | 8/2005 | Watanabe | |

FOREIGN PATENT DOCUMENTS

| | | |
|---|---|---|
| JP | 63-275095 A | 11/1988 |
| JP | 2002-140890 A | 5/2002 |

* cited by examiner

*Primary Examiner* — Edward Dudek, Jr.
*Assistant Examiner* — Ralph A Verderamo, III
(74) *Attorney, Agent, or Firm* — Arent Fox LLP

(57) ABSTRACT

An interface includes a controller that divides a burst access command into a plurality of command cycles and supplies the plurality of command cycles to a storage device including a plurality of blocks, and a block address converter that outputs an address at a first command cycle of the plurality of command cycles. The address is obtained by shifting at least one bit of an external block address input in response to the burst access command. The address is supplied to the storage device at the first command cycle, and the external block address is supplied to the storage device at a command cycle other than the first command cycle.

9 Claims, 9 Drawing Sheets

FIG. 5

| FSA | WRITE COMMAND | |
| --- | --- | --- |
| | C0 | C1 |
| "00" | WD1 + WD2 | WD3 + WD4 |
| "01" | WD4 + WD1 | WD2 + WD3 |
| "10" | WD3 + WD4 | WD1 + WD2 |
| "11" | WD2 + WD3 | WD4 + WD1 |

FIG. 6
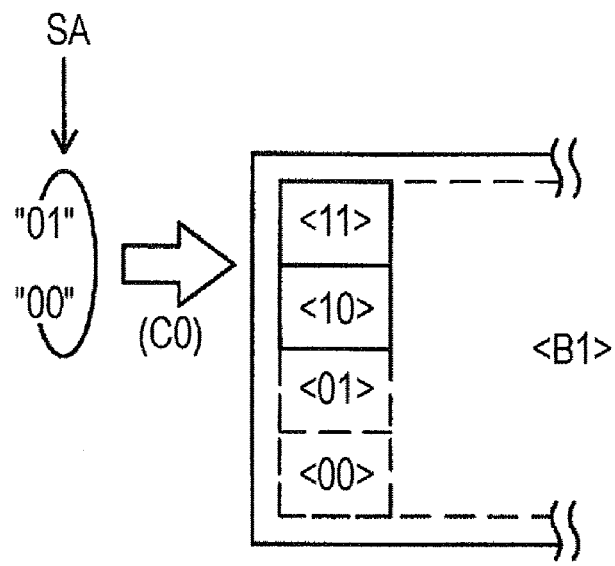
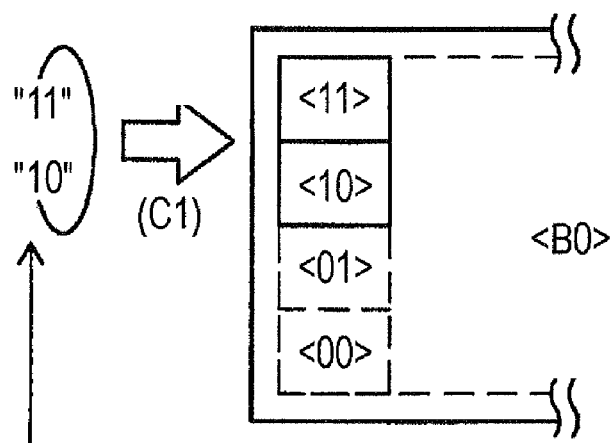
(SWITCH BLOCKS AT UPPER BITS)

FIG. 9
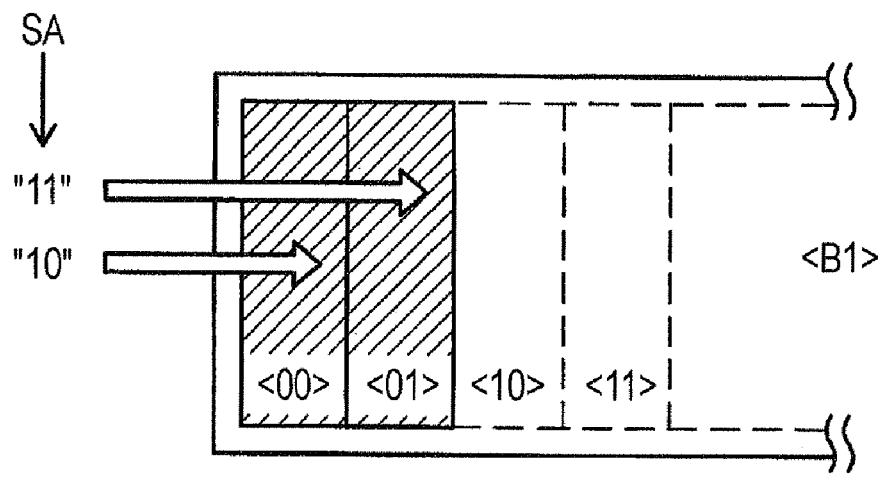
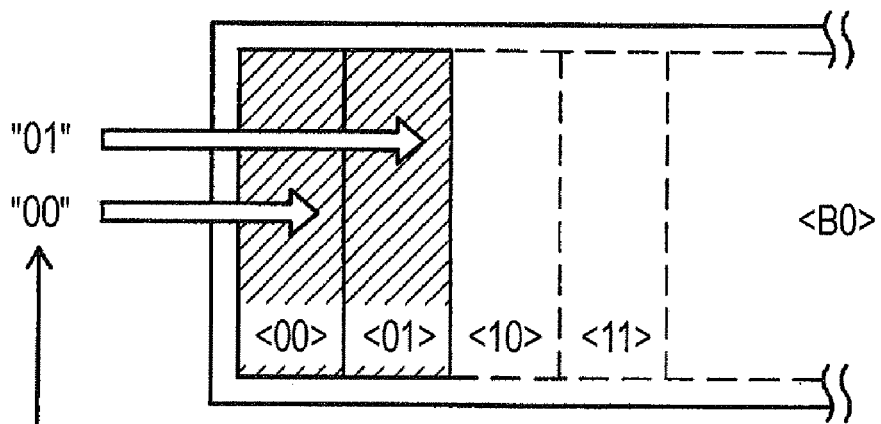
(SWITCH BLOCKS AT UPPER BITS)

INTERFACE, MEMORY SYSTEM, AND ACCESS CONTROL METHOD

CROSS-REFERENCE TO RELATED APPLICATIONS

This application claims the benefit of priority from Japanese Patent Application No. 2009-82881 filed on Mar. 30, 2009, the entire contents of which are incorporated herein by reference.

BACKGROUND

1. Field

The embodiments discussed herein relate to an interface.

2. Description of Related Art

Memories may include static random-access memory (SRAM) having a static memory cell including six transistors, a dynamic random-access memory (DRAM) having a dynamic memory cell including one transistor and one capacitor, etc. The DRAM accommodates a larger number of memory cells because a memory cell area of the DRAM is smaller than that of the SRAM. A refresh operation is performed in the DRAM because charge accumulated as data on the capacitor is reduced in the form of a leakage current.

A pseudo SRAM is a DRAM having a self-refreshing function. In response to a refresh command input, an address of a memory cell to be refreshed is automatically generated and the refresh operation is performed.

Related techniques are disclosed in Japanese Laid-open Patent Publication No. H63-275095, and Japanese Laid-open Patent Publication No. 2002-140890.

SUMMARY

According to one aspect of the embodiments, an interface is provided which includes a controller that divides a burst access command into a plurality of command cycles and supplies the plurality of command cycles to a storage device including a plurality of blocks, and a block address converter that outputs an address at a first command cycle of the plurality of command cycles. The address is obtained by shifting at least one bit of an external block address input in response to the burst access command. The address is supplied to the storage device at the first command cycle, and the external block address is supplied to the storage device at a command cycle other than the first command cycle.

Additional advantages and novel features of the invention will be set forth in part in the description that follows, and in part will become more apparent to those skilled in the art upon examination of the following or upon learning by practice of the invention.

BRIEF DESCRIPTION OF THE DRAWINGS

FIG. 5 illustrates an exemplary combination of data;

FIG. 6 illustrates an exemplary block switching operation;

FIG. 9 illustrates an exemplary block switching operation.

DESCRIPTION OF EMBODIMENTS

If an access time to the same block is excessive, data in the storage device performing a refresh operation may be lost. The storage device monitors the access time and performs the refresh operation within a time period not exceeding the given time.

Figure 1:
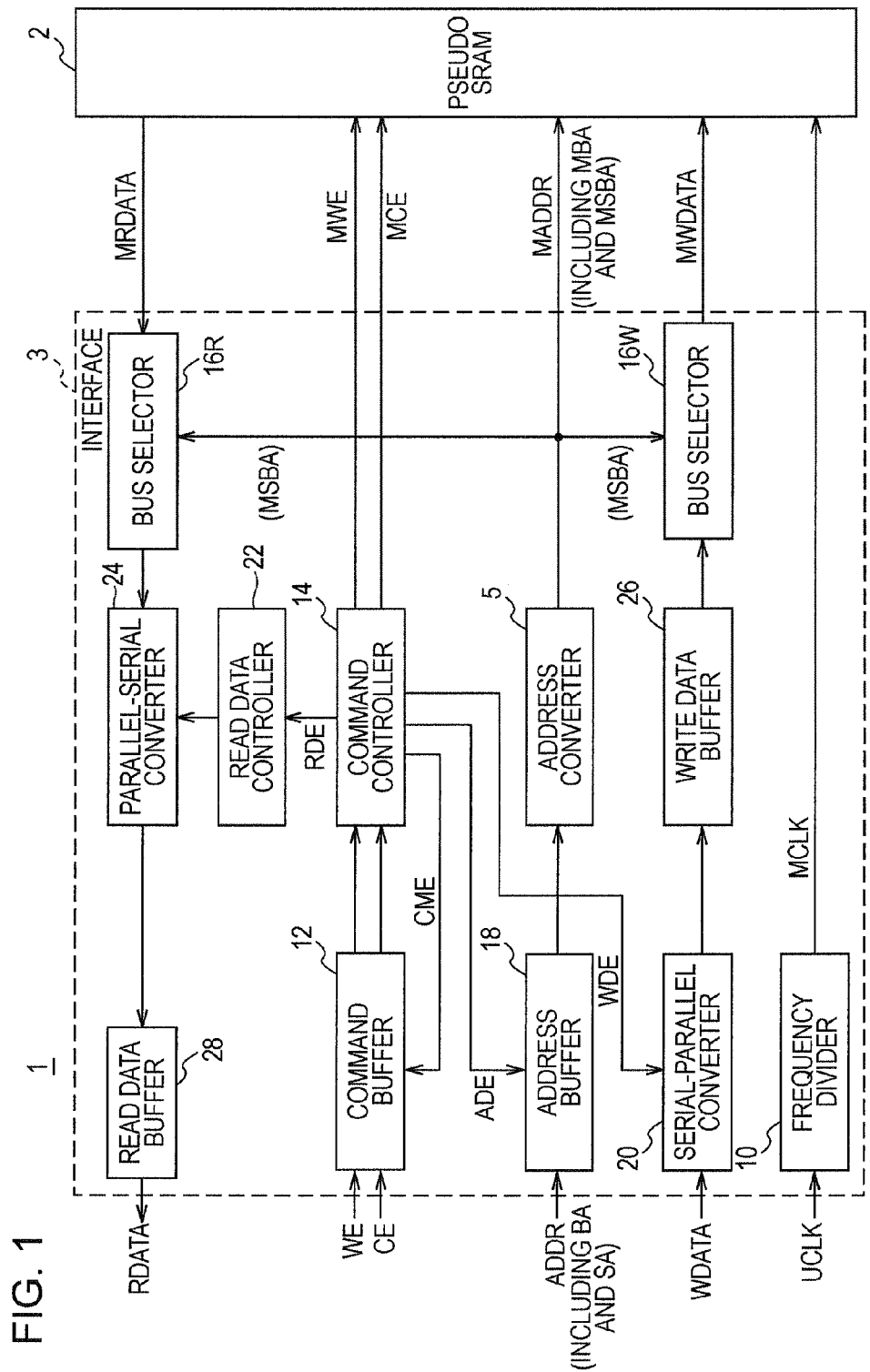
FIG. 1 illustrates an exemplary an interface circuit.

FIG. 1 illustrates an exemplary interface. A memory system 1 includes a pseudo SRAM 2, and the interface 3 interfacing the pseudo SRAM 2 to an external controller (not shown). The interface 3 interfaces an input-output bus of the external controller (not shown) to an input-output bus of the pseudo SRAM 2 different in bit width from the input-output bus of the external controller. The interface 3 also interfaces operation clocks between the pseudo SRAM 2 and the external controller. The interface 3 illustrated in FIG. 1 may be applied to another memory different from the pseudo SRAM 2. The pseudo SRAM 2 is an exemplary volatile memory, and performs the refresh operation.

The external controller accesses the pseudo SRAM 2 with a burst length of 4 (BL=4). For example, the bit width of an internal read data bus MRDATA for reading data from the pseudo SRAM 2 to the interface 3 may be set to be four times the bit width of an external read data bus RDATA for reading data from the interface 3 to the outside. For example, the bit width of an internal write data bus MWDATA for writing data from the interface 3 to the pseudo SRAM 2 may be set to four times the bit width of an external write data bus WDATA for transferring data from the outside to the interface 3. For example, each of the external read data bus RDATA and the external write data bus WDATA may have a bit width of 64 bits, and each of the internal read data bus MRDATA and the internal write data bus MWDATA may have a bit width of 256 bits.

The burst length refers to the number of clocks for performing a burst transfer in response to a user clock UCLK. For example, if the burst length is 4 (BL=4), the burst transfer is performed within a period of 4 user clocks UCLK. The burst length may be set by the external controller (not shown).

A microclock MCLK, which is generated by dividing the user clock UCLK by two, is supplied to the pseudo SRAM 2. When the microclock MCLK is transitioned from a low level to a high level, the pseudo SRAM 2 receives commands. The commands include a write command or a read command to the pseudo SRAM 2. For example, the pseudo SRAM 2 processes one command at one cycle of the microclock MCLK. The cycle during when the microclock MCLK processes the command is referred to as a command cycle.

The external controller (not shown) may perform a burst access of a burst length of 4 (BL=4) through the external read data bus RDATA or the external write data bus WDATA, each having a 64 bit width. The access may be performed at one command cycle if the internal read data bus MRDATA or the internal write data bus MWDATA, each having the 256 bit width, in the pseudo SRAM 2 is used.

The access may also be performed at two or four command cycles using half or quarter of the bit width of 256 bits. During this process, a block to be accessed may be switched. The refresh operation may be performed on the block because the continuous access of the same block is not performed. Thus, the access time of the continuous access is not limited.

The user clock UCLK is input to the frequency divider 10. The frequency divider 10 outputs the microclock MCLK, which is generated by dividing the user clock UCLK by two. The microclock MCLK is input to the pseudo SRAM 2. When the microclock MCLK is transitioned to a high level, the pseudo SRAM 2 captures each signal and data. The microclock MCLK serves as an operation clock of the pseudo SRAM 2.

A chip capturing signal CE and a write capturing signal WE are input to the command buffer 12. The command buffer 12 supplies the chip capturing signal CE and the write capturing signal WE to the command controller 14. The command controller 14 outputs an internal chip capturing signal MCE and an internal write capturing signal MWE. The internal chip capturing signal MCE and the internal write capturing signal MWE are input to the pseudo SRAM 2.

The pseudo SRAM 2 operates in response to the internal chip capturing signal MCE and the internal write capturing signal MWE. For example, the pseudo SRAM 2 performs a write operation when the internal chip capturing signal MCE is at a low level and the internal write capturing signal MWE is at a low level (write command). The pseudo SRAM 2 performs a read operation when the internal chip capturing signal MCE is at a low level and the internal write capturing signal MWE is at a high level (read command).

The command controller 14 outputs an external command capturing signal CME, an address capturing signal ADE, a write data capturing signal WDE, and a read data capturing signal RDE. The external command capturing signal CME is supplied to the command buffer 12, the address capturing signal ADE is supplied to the address buffer 18, the write data capturing signal WDE is supplied to the serial-parallel converter 20, and the read data capturing signal RDE is supplied to the parallel-serial converter 24 via the read data controller 22.

An external address bus ADDR is coupled to the address buffer 18. An address identifying a memory cell in the pseudo SRAM 2 is input to the external address bus ADDR. The address includes an external block address BA designating a block, which is an access unit. The block may be a section of a memory cell array to be accessed at a burst access, and may be referred to as a sector. The address includes an identification address SA designating a storage location of data to be transferred at a first cycle of the burst access. In the burst access, data is transferred by dispersing a plurality of cycles of the user clock UCLK. For example, if the burst length is 4 (BL=4), the data is transferred in 4 cycles. The identification address SA designates a storage location of the data to be transferred at the cycle of the burst access within the block.

The number of bits of the external block address BA corresponds to the blocks within the pseudo SRAM 2. The number of bits of the identification address SA corresponds to the burst length. For example, if the pseudo SRAM 2 includes two blocks, the external block address BA is represented by one bit. If the burst length is 4 (BL=4), the identification address SA is represented by 2 bits.

The address captured by the address buffer 18 is input to an address converter 5 and bus selectors 16R and 16W. The address converter 5 outputs the address to an internal address bus MADDR. The output address includes an internal block address MBA, and an internal subblock address MSBA designating part of the block as a data storage area. The internal address bus MADDR is coupled to the pseudo SRAM 2.

The internal block address MBA corresponds to an unconverted external block address BA or an address in which at least one bit of the external block address MBA is logically shifted by the address converter 5. Even if data has a size accessible to the same block, a region to be accessed within the block is designated as a data storage area in order to access by switching the blocks.

The internal subblock address MSBA is input to each of the bus selectors 16R and 16W. The bus selectors 16R and 16W are arranged to read or write data, and are substantially identical to each other in structure. The internal read data bus MRDATA is coupled to a parallel-serial converter 24, and a write data buffer 26 is coupled to the internal write data bus MWDATA. In the bus selectors 16R and 16W, a bit width portion of one of the internal read data bus MRDATA and the internal write data bus MWDATA is partially selected and used to transfer data. The internal subblock address MSBA is input to the pseudo SRAM 2. In response to the internal subblock address MSBA, the pseudo SRAM 2 controls the bit width portion of one of the internal read data bus MRDATA and the internal write data bus MWDATA to be used to transfer data. The internal subblock address MSBA selects a quarter of or half the bit width of 256 bits.

The serial-parallel converter 20 couples to the external write data bus WDATA. The external write data bus WDATA has a bit width of 64 bits. Data of 64 bits is successively input to the serial-parallel converter 20 by clock in four clock periods of the user clock UCLK in response to the burst access. The serial-parallel converter 20 converts data of 64 bit width input into parallel data in the four clock periods of the user clock UCLK, and outputs the resulting parallel data to the write data buffer 26. The data to be stored on the write data buffer 26 is output to the pseudo SRAM 2 in a bit width according to the bit width portion selected by the bus selector 16W. If the bit width portion selected by the bus selector 16W is half the bit width of 256 bits, for example, a 128 bit width, the bit width is expanded to twice the bit width of the external write data bus WDATA (i.e., 64 bits). If the bit width portion selected by the bus selector 16W is a quarter of the bit width of 256 bits, for example, a 64 bit width, the bit width becomes substantially identical to the bit width of the external write data bus WDATA (i.e., 64 bits).

The parallel-serial converter 24 is supplied with the data of the bit width portion selected by the bus selector 16R. The parallel-serial converter 24 converts the received data into four serial data segments, which are then output to the external read data bus RDATA via the read data buffer 28. If the bit width portion selected by the bus selector 16R is half the bit width of 256 bits, for example, a 128-bit width, the parallel-serial converter 24 divides the 256 bit data, which is read in two read cycles, by four, and the converted data is burst-read with BL=4 via the external read data bus RDATA (with a bit width of 64 bits). If the bit width portion selected by the bus selector 16R is a quarter of the bit width of 256 bits, for example, a 64-bit width, the parallel-serial converter 24 divides the 256 bit data, which is read in four read cycles, by four, and the converted data is burst-read with BL=4 via the external read data bus RDATA (with a bit width of 64 bits).

Figure 2:
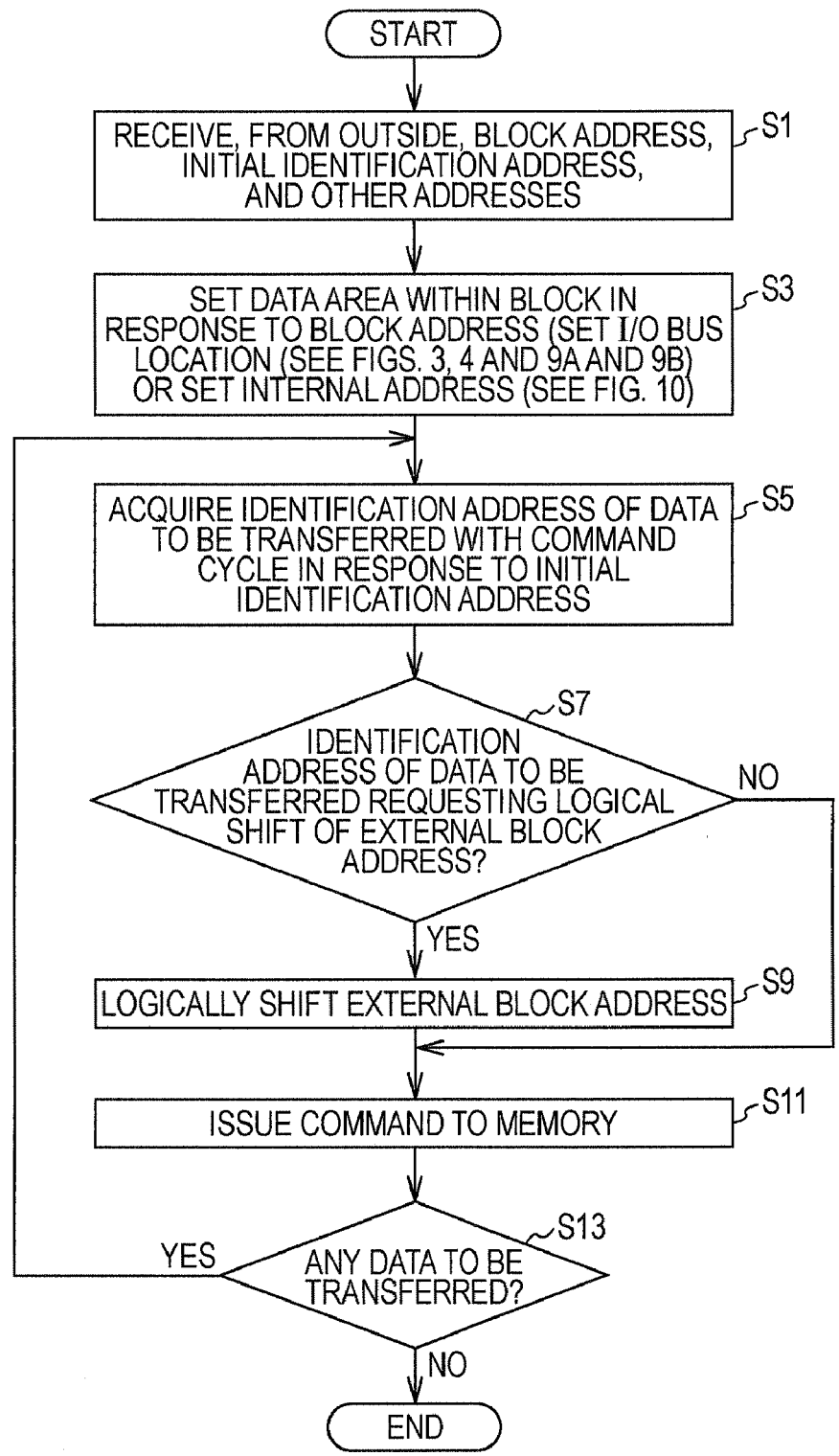
FIG. 2 illustrates an exemplary process of an interface circuit.

FIG. 2 illustrates an exemplary process of an interface circuit. When a burst access starts in response to a command from the external controller (not shown), the addresses including the external block address BA and an initial identification address FSA are input to the address buffer 18 via the external address bus ADDR (S1). The addresses input to the address buffer 18 are then supplied to the address converter 5. In response to the external block address BA, the address converter 5 sets a data storage area within the block (S3). In response to the internal subblock address MSBA designating the data storage area, the bus selectors 16R and 16W set the bit width portion of each of the internal read data bus MRDATA and the internal write data bus MWDATA. The internal subblock address MSBA designating the data storage area is output as an address designating the inside of the block to the pseudo SRAM 2.

In response to the initial identification address FSA input from the outside at a first cycle of the burst access, the address converter 5 acquires the identification address SA of the data transferred at the command cycle (S5). The identification address SA corresponding to the data transferred at each cycle of the burst access is acquired by incrementing the initial identification address FSA as an initial value by "1" at each cycle.

It is determined whether the identification address SA of the data transferred in the command cycle instructs to logically shift at least one bit of the external block address BA (S7). If the identification address SA has a given logical value, at least one bit of the external block address BA is logically shifted. Block switching is performed on the data corresponding to the identification address SA.

A logical value of a block switching address is converted in the logical shifting. For example, the block switching address may be 2 bits. If the block switching address having a logical value of "00" is logically shifted, the logical value may be one of "01," "10," or "11."

If the identification address SA instructs to shift the external block address BA (YES in S7), the bit value of the bit position corresponding to the external block address BA is logically shifted. For example, the logical value of the bit is inverted or "1" is added to the bit. The address resulting from logically shifting the external block address BA corresponds to the internal block address MBA. The internal block address MBA designates a block within the pseudo SRAM 2. If the identification address SA does not instruct to shift the external block address BA (NO in S7), a process S9 is skipped. The internal block address MBA may be substantially identical to the external block address BA.

After the internal block address MBA is set, a command is issued to the pseudo SRAM 2 (S11). The command controller 14 outputs to the pseudo SRAM 2 the internal chip capturing signal MCE and the internal write capturing signal MWE and the address converter 5 outputs to the pseudo SRAM 2 the address including the internal block address MBA. In a write command, write data is output via the bus selector 16W. In a read command, read data is acquired via the bus selector 16R.

After the command is issued, the presence or absence of untransferred data is checked (S13). If any untransferred data remains (YES in S13), processing returns to operation S5 to repeat the above described processes. The processes are repeated until no untransferred data remains (NO in S13).

Figure 3:
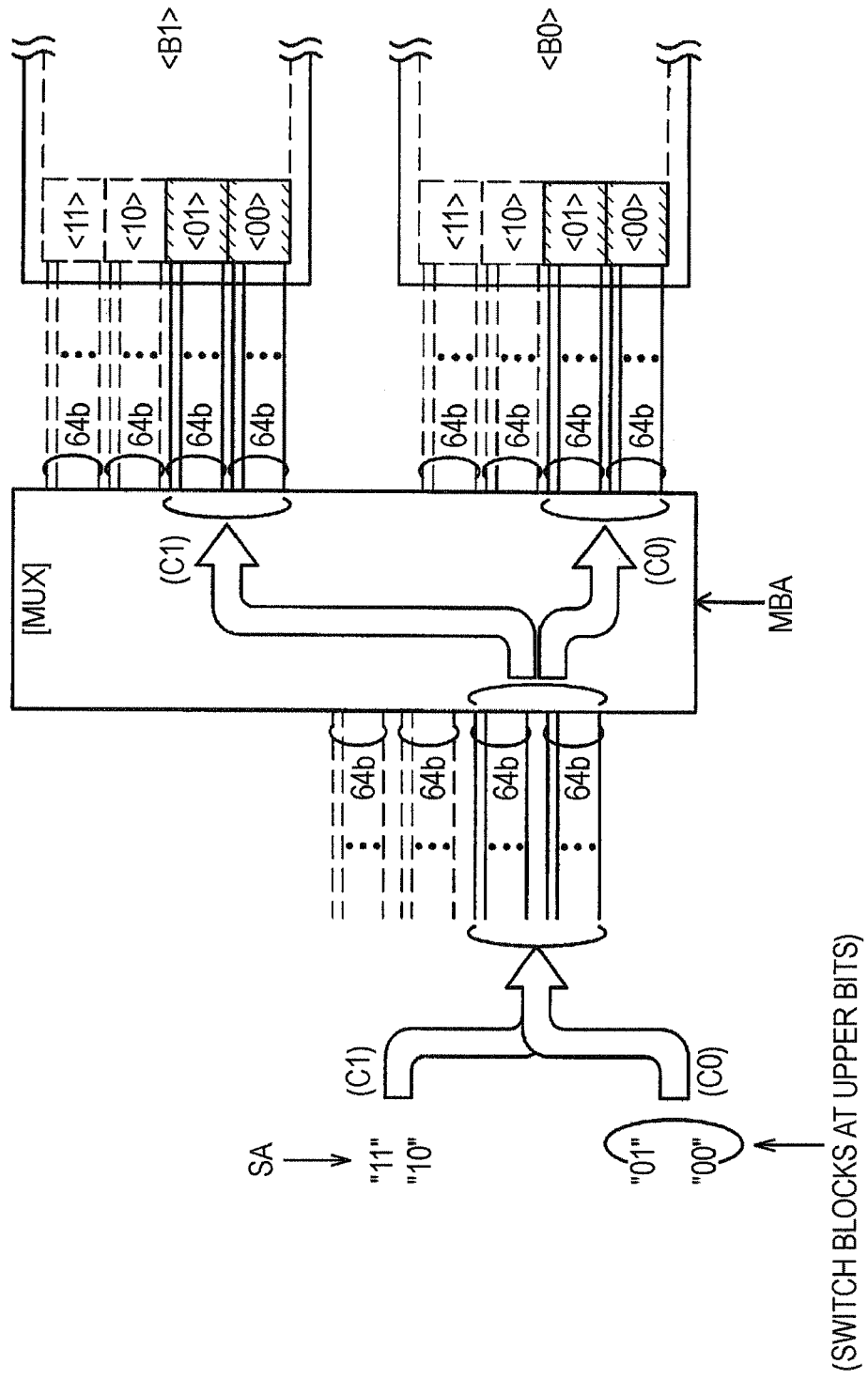
FIG. 3 illustrates an exemplary block switching operation.

FIG. 3 illustrates an exemplary block switching operation. The bit width of the external read data bus RDATA and the external write data bus WDATA between the external controller (not shown) and the interface 3 is 64 bits in a block switching operation (I) illustrated in FIG. 3. The bit width of the internal read data bus MRDATA and the internal write data bus MWDATA between the interface 3 and the pseudo SRAM 2 is 256 bits. The pseudo SRAM 2 includes two blocks. In the burst access of a burst length of 4 (BL=4), for example, the access is performed in two command cycles. For example, the external block address BA input from the outside is "0."

A circuit block diagram of FIG. 3 may illustrate the internal structure of the pseudo SRAM 2. A 256-bit input-output bus is arranged for each of the two blocks <B0> and <B1>. The input-output bus may correspond to one of the internal read data bus MRDATA and the internal write data bus MWDATA illustrated in FIG. 1. The 256-bit input-output bus may be divided into four bit-width regions for each region having 65 bits. The four bit-width regions are respectively coupled to four data storage areas within blocks <B0> and <B1>. When <00>, <01>, <10> and <11> represent the four physical data storage areas, the initial identification address FSA represents one of the data storage areas <00>, <01>, <10> and <11> in the burst access.

The data storage area to be accessed is set in response to the external block address BA. Since the external block address BA="0," the data storage areas <00> and <01> are set as access targets. If an upper bit of the identification address SA having 2 bits is at "1," the external block address BA is logically shifted. A lower bit of the identification address SA designates the data storage area <00> and <01>.

In the case of the identification address SA="00" or "01," the internal block address MBA has the same value as the external block address BA, i.e., has "0." A multiplexer MUX selects the block <B0>. The data identified by the identification address SA="00" or "01" is stored in the data storage area <00> or <01> of the block <B0>.

In the case of the identification address SA="10" or "11," the internal block address MBA becomes "1" by logical-shifting the external block address BA (="0"). The multiplexer MUX selects the block <B1>. The data identified by the identification address SA="10" or "11" is stored in the data storage area <00> or <01> of the block <B1>.

The bus selector 16x (x=R or W) selects a bit width region of the lower half of one of the internal read data bus MRDATA and the internal write data bus MWDATA in response to the setting (=<LO>) of the internal subblock address MSBA. The data storage regions <00> and <01> are set to be access targets. Data assignment may be performed within the bit width region limited to half.

Figure 4:
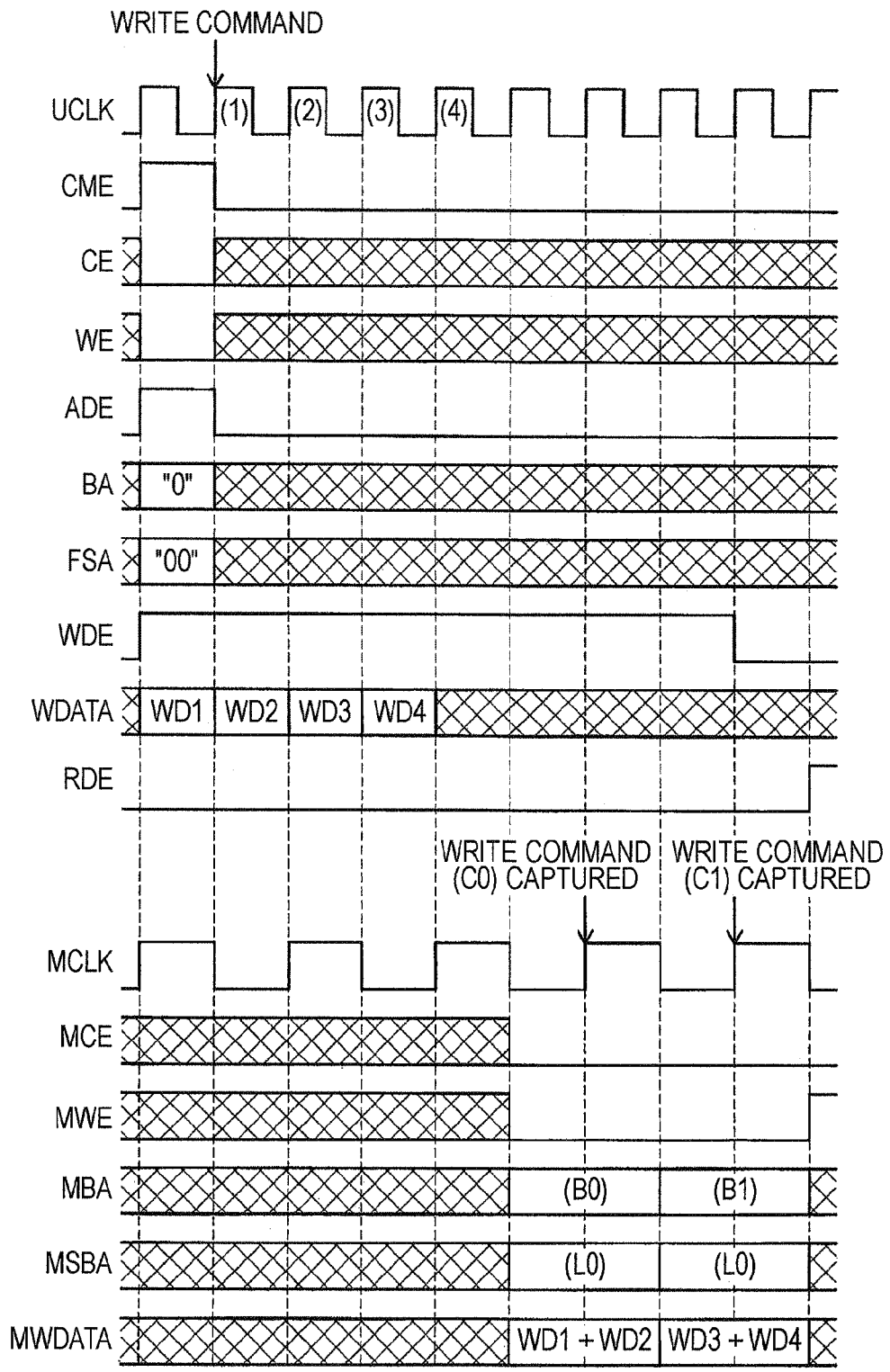
FIG. 4 illustrates an exemplary burst write operation.

FIG. 4 illustrates an exemplary burst write operation. A burst read operation in FIG. 4 may be substantially identical or similar to the burst write operation.

In a first cycle of the burst write operation, "0" as the external block address BA and "00" as the initial identification address FSA are input to the interface 3 (at a rising edge of cycle (1)). "WD1," "WD2," "WD3," and "WD4" as write data are input to the interface 3 in cycles of the burst write operation respectively (at rising edges of cycles (1)-(4)).

The data "WD1," "WD2," "WD3," and "WD4," each having 64 bits, are input in 2 command cycles. In each command cycle, 128 bit data containing the two data, each data unit having 64 bits, is written. Since a data unit combination becomes different in response to the initial identification address FSA, the command cycle is issued after all the data "WD1," "WD2," "WD3," and "WD4" are stored in the write data buffer 26. As illustrated in FIG. 4, the data "WD1" and the data "WD2" in combination are together output in the first write command cycle (C0), and the data "WD3" and the data "WD4" in combination are together output in the second write command cycle.

The data combination changes in response to the initial identification address FSA. If two cycle data of the burst write operation are combined in one cycle of the write command cycle, the data are combined in response to the identification address SA. The identification address SA of each data is determined based on an initial value corresponding to the initial identification address FSA. For this reason, the data combination is determined in response to the initial identification address FSA.

The identification address SA may be "00." Identification addresses SA of the data "WD1," "WD2," "WD3," and "WD4" may be respectively, "00," "01," "10," and "11." In the first write command cycle (C0), the data "WD1" and the data "WD2" in combination are together output in the first write command cycle (C0), and the internal block address MBA designates the block <B0>. The data "WD3" and the data "WD4" in combination are together output in the second write command cycle, and the internal block address MBA designates the block <B1>.

The lower half bit region of each of the internal read data bus MRDATA and the internal write data bus MWDATA is selected, and the data storage areas <00> and <01> are set as the access targets. The internal subblock address MSBA remains at <LO>.

FIG. 5 illustrates exemplary data combinations. The data combinations illustrated in FIG. 5 may be data combinations for the initial identification address FSA. If the initial identification address FSA is "01," the identification addresses SA of the data "WD1," "WD2," "WD3," and "WD4" are respectively "01," "10," "11," and "00." The data "WD4" and the data "WD1" in combination are together output in the first write command cycle (C0), and the data "WD2" and the data "WD3" in combination are together output in the second write command cycle. If the initial identification address FSA is "10," the identification addresses SA of the data "WD1," "WD2," "WD3," and "WD4" are respectively "10," "11," "00," and "01." The data "WD3" and the data "WD4" in combination are together output in the first write command cycle (C0), and the data "WD1" and the data "WD2" in combination are together output in the second write command cycle. If the initial identification address FSA is "11," the identification addresses SA of the data "WD1," "WD2," "WD3," and "WD4" are respectively "11," "00," "01," and "10." The data "WD2" and the data "WD3" in combination are together output in the first write command cycle (C0), and the data "WD4" and the data "WD1" in combination are together output in the second write command cycle.

FIG. 6 illustrates an exemplary switching operation. As illustrated in FIG. 6, each of the external read data bus RDATA and the external write data bus WDATA may be 64 bits, and each of the internal read data bus MRDATA and the internal write data bus MWDATA may be 256 bits. The burst length may be 4 (BL=4), the number of blocks is 2, and the number of command cycles may be 2. In the block switching operation (I) illustrated in FIG. 6, the external block address BA input from the outside is "1," for example. The block switching operation illustrated in FIG. 6 may be substantially identical or similar to the block switching operation illustrated in FIGS. 3 and 5. The data storage areas <10> and <11> are set as access targets.

If the upper bit of the two bits of the identification address SA is "1," the external block address BA is logically shifted as illustrated in FIGS. 3-5. In the case of the identification address SA="00" or "01," the internal block address MBA has the same value as the external block address BA, i.e., has "1." The block <B1> is selected. The data identified by the identification address SA="00" or "01" is stored in the data storage area <10> or <11> of the block <B1>.

In the case of the identification address SA="10" or "11," the internal block address MBA becomes "0" by logical-shifting the external block address BA (="1"). The block <B0> is selected. The data identified by the identification address SA="10" or "11" is stored in the data storage area <10> or <11> of the block <B0>.

The bus selector 16x (x=R or W) selects a bit width region of the upper half of one of the internal read data bus MRDATA and the internal write data bus MWDATA in response to the setting (=<HI>) of the internal subblock address MSBA. The data storage areas <10> and <11> are set as access targets.

Figure 7:
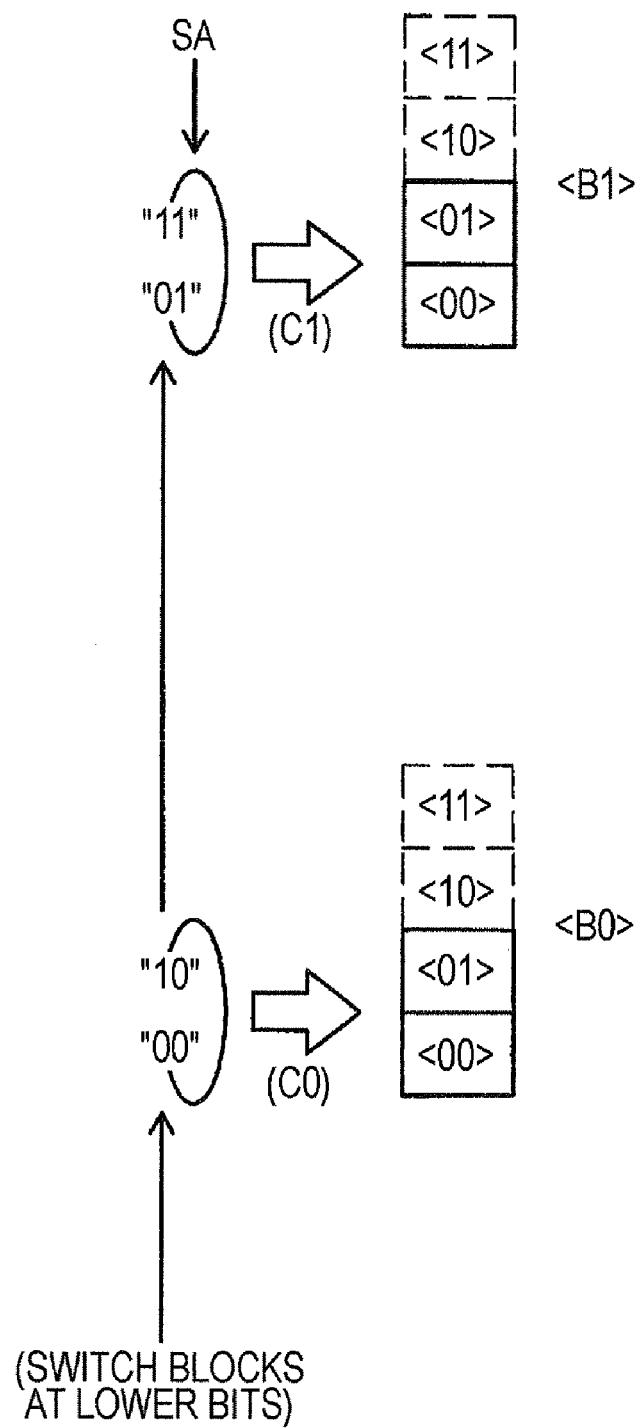
FIG. 7 illustrates an exemplary block switching operation.

FIG. 7 illustrates an exemplary switching operation. As illustrated in FIG. 7, each of the external read data bus RDATA and the external write data bus WDATA may have 64 bits, and each of the internal read data bus MRDATA and the internal write data bus MWDATA may have 256 bits. The burst length may be 4 (BL=4), the number of blocks may be 2, and the number of command cycles may be 2.

The block switching operation (II) illustrated in FIG. 7 may be substantially identical or similar to the block switching operation (I) illustrated in FIGS. 3 through 6. The external block address BA input from the outside may be "0." If the lower bit of the 2 bits of the identification address SA is "1," the external block address BA is logically shifted.

In the case of the identification address SA="00" or "10," the internal block address MBA has the same value as the external block address BA, i.e., has "0." The block <B0> is selected. The data identified by the identification address SA="00" or "10" is stored in the data storage area <00> or <01> of the block <B0>. The data storage area <00> or <01> is determined in response to the upper bit of the identification address SA="00" or "10."

In the case of the identification address SA="01" or "11," the internal block address MBA becomes "1" by logical-shifting the external block address BA (="0"). The block <B1> is selected. The data identified by the identification address SA="01" or "11" is stored in the data storage area <00> or <01> of the block <B1>.

The bus selector 16x (x=R or W) selects a bit width region of the lower half of one of the internal read data bus MRDATA and the internal write data bus MWDATA in response to the setting (=<LO>) of the internal subblock address MSBA. The data storage areas <01> and <11> are set as access targets.

Figure 8:
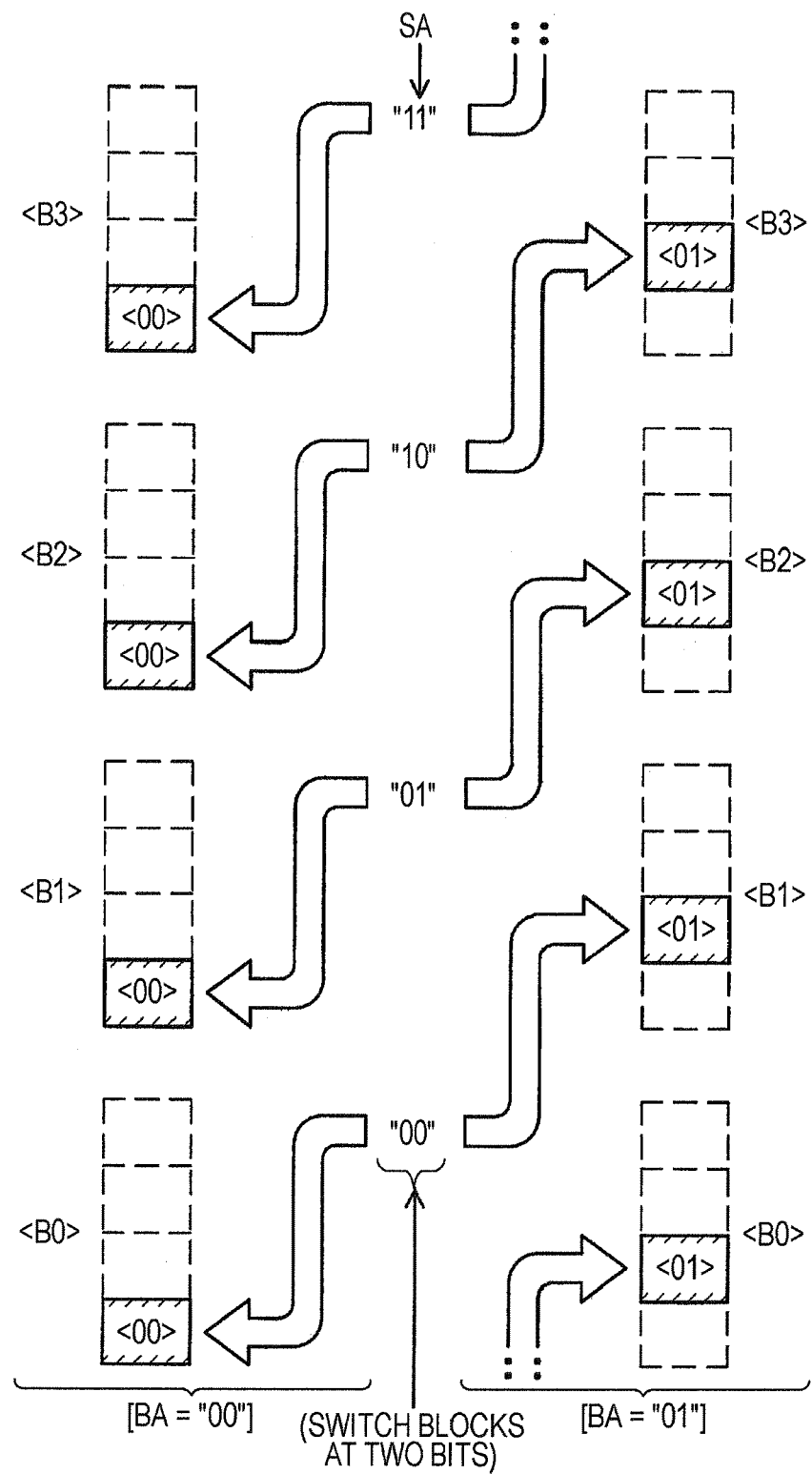
FIG. 8 illustrates an exemplary block switching operation.

FIG. 8 illustrates an exemplary switching operation. As illustrated in FIG. 8, each of the external read data bus RDATA and the external write data bus WDATA may have 64 bits, and each of the internal read data bus MRDATA and the internal write data bus MWDATA may have 256 bits. The burst length may be 4 (BL=4), the number of blocks may be 4, and the number of command cycles may be 4.

In the block switching operations (I) and (II) illustrated in FIGS. 3-7, the two blocks are provided, and the access is performed in two command cycles. In a block switching operation (III) illustrated in FIG. 8, 4 blocks are provided, and the access is performed in 4 command cycles. The external block address BA input from the outside is "00" or "01."

The burst length is 4 (BL=4). Since the pseudo SRAM 2 includes the 4 blocks, a block is designated for the bit value of each bit of the identification address SA having 2 bits. As in the block switching operations (I) and (II) illustrated in FIGS. 3 through 7, the data storage area within the block is set in response to the external block address BA. If the external block address BA is "00," the data storage area <00> is designated. If the external block address BA is "01," the data storage area <01> is designated. If the external block address BA is "10," the data storage area <10> is designated (not illustrated), and if the external block address BA is "11," the data storage area <11> is designated (not illustrated).

In the case of the external block address BA="00," the data storage area <00> of the block <B0>, the data storage area <00> of the block <B1>, the data storage area <00> of the block <B2>, and the data storage area <00> of the block <B3> are respectively selected in response to the identification addresses SA "00," "01," "10," and "11." In the case of the external block address BA="01," the data storage area <01> of the block <B0>, the data storage area <01> of the block <B1>, the data storage area <01> of the block <B2>, and the data storage area <01> of the block <B3> are respectively selected in response to the identification addresses SA "00," "01," "10," and "11."

The bus selector 16x (x=12 or W) selects a bit width region (64 bits) of a quarter of one of the internal read data bus MRDATA and the internal write data bus MWDATA in response to the internal subblock address MSBA.

FIG. 9 illustrates an exemplary switching operation. As illustrated in FIG. 9, each of the external read data bus RDATA and the external write data bus WDATA has 64 bits, and each of the internal read data bus MRDATA and the internal write data bus MWDATA may have 64 bits. The burst length may be 4 (BL=4), the number of blocks may be 2, and the number of command cycles may be 4.

In the block switching operations (I)-(III) illustrated in FIGS. 3-8, each of the internal read data bus MRDATA and the internal write data bus MWDATA between the interface 3 and the pseudo SRAM 2 may have a bit width of 256 bits. The access is performed in 2 command cycles. In the block switching operation (IV) illustrated in FIG. 9, the bit width of each of the internal read data bus MRDATA and the internal write data bus MWDATA may be 64 bits, and the access is performed in 4 command cycles. For example, the external block address BA input from the outside is "0."

In the block switching operation (IV) illustrated in FIG. 9, the bit width of each of the external read data bus RDATA, the external write data bus WDATA, the internal read data bus MRDATA, and the internal write data bus MWDATA may be 64 bits. If the burst length may be 4 (BL=4), the accessing is performed in 4 command cycles.

FIG. 9 illustrates an exemplary data storage area within a block to be accessed. Since all the bit widths of the input-output buses of the pseudo SRAM 2 are used, the data area within the block to be accessed per a command cycle may substantially coincident with the data area of the bit width.

The external block address BA may be "0." The data storage area <00> of the block <B0>, the data storage area <01> of the block <B0>, the data storage area <00> of the block <B1>, and the data storage area <01> of the block <B1> are respectively assigned to the identification addresses SA "00," "01," "10," and "11" of data.

In given command cycles, from among a plurality of command cycles issued to the pseudo SRAM 2 in response to a burst access from the outside, the external block address BA is supplied as the internal block address MBA, and the data storage area of the pseudo SRAM 2 is accessed. In the rest of the command cycles, for example, in the first command cycle, the external block address BA logically shifted is supplied as the internal block address MBA, and the data storage area within the pseudo SRAM 2 is thus accessed. Blocks to be accessed are switched in a plurality of command cycles issued in response to the burst access. In the burst access to the pseudo SRAM 2, the same block is not continuously accessed, and the refresh operation is performed on the block.

In the block switching operations illustrated in FIGS. 3-6, the data storage areas of the blocks <B0> and <B1> are set as access targets. The data storage area serving as an access target is determined in response to the external block address BA. If the external block address BA is "0," the data storage areas <00> and <01> are set as the access targets. If the external block address BA is "1," the data storage areas <10> and <11> are set as the access targets. Since the external block address BA has a constant address with respect to the burst access, access is performed on a given data storage area on a burst access basis. Access is performed using the bit width region of the input-output bus.

The block switching operation is performed on the upper bit of the identification address SA having a 2-bit size. If the upper bit is "1," the external block address BA is logically shifted. Access is performed on a block different from the external block address BA.

Accessing each data storage area is designated by a lower bit of the identification address SA. The data storage area is thus selected in response to the lower bit of the identification address SA.

The block switching operation (II) illustrated in FIG. 7 has substantially the same advantages as or similar advantages to those in the block switching operation (I) illustrated in FIGS. 3-6. The data storage area in the block <B0> and <B1> is set to be an access target. Access is thus performed using the bit width region of the input-output bus.

In the block switching operation (II) illustrated in FIG. 7, the blocks are switched in response to the lower bit of the identification address SA of the 2-bit size. If the lower bit is "1," the external block address BA is logically shifted. Access is performed on a block different from the external block address BA.

The data storage areas are individually designated by the upper bit of the identification address SA. The data storage area is thus selected in response to the upper bit of the identification address SA.

The block switching operation (III) illustrated in FIG. 8 has substantially the same advantages as or similar advantages to those in the block switching operation (I) illustrated in FIGS. 3-6. The data storage area in each of the blocks <B0>-<B3> is set to be an access target. Access is thus performed using the bit width region of the input-output bus.

In the block switching operation (III) illustrated in FIG. 8, the blocks are switched in response to the 2 bits of the identification address SA. The external block address BA is logically shifted in response to the bit value of the identification address SA and the access target is switched to one of the blocks <B0>-<B3>. Access is performed on a block different from the external block address BA.

Data of 64 bits is transferred per command cycle. The bit width of 64 bits may be equal to the bit width of the burst access. The data corresponding to 4 cycles of the burst access may not be stored in the write data buffer 26. The data is thus transferred to the pseudo SRAM 2 on a cycle basis of the burst cycle.

The accessing each data storage area is performed in response to the identification address SA.

The block switching operation (IV) illustrated in FIG. 9 has substantially the same advantages as or similar advantages to those in the block switching operation (I) illustrated in FIGS. 3-6. The data storage area in each of the blocks <B0> and <B1> is set to be an access target. Access is thus performed using the bit width region of the input-output bus.

In the block switching operation (IV) illustrated in FIG. 9, each of the bit width of the input-output bus and the bit width of the burst access may be 64 bits. Data of 64 bits is thus transferred in substantially the same manner as in the block switching operation (III) illustrated in FIG. 8.

The accessing each data storage area is performed in response to the identification address SA.

The previous embodiments may be applied to a memory performing a refresh operation. In the previous embodiment, the bit combination of the identification address SA may be freely selected as a block switching condition. The block switching operation may be performed in a given command cycle. In the plurality of blocks accessed through a plurality of command cycles, a data storage area corresponding to an identification address may be accessed. In each block, the data corresponding to the identification address SA is stored in the data storage area. Example embodiments of the present invention have now been described in accordance with the above advantages. It will be appreciated that these examples are merely illustrative of the invention. Many variations and modifications will be apparent to those skilled in the art.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

The invention claimed is:

1. An interface, comprising:
   a controller that divides a burst access command, which comprises an external block address and an initial address to be incremented, into a plurality of command cycles, and supplies the plurality of command cycles to a storage device including a plurality of blocks; and
   a block address converter that outputs an address at a first command cycle of the plurality of command cycles, the outputted address being obtained by shifting at least one bit of the external block address input in response to the burst access command,
   wherein the outputted address is supplied to the storage device at the first command cycle, and the external block address is supplied to the storage device at one of the plurality of command cycles other than the first command cycle.

2. The interface according to claim 1, wherein the plurality of command cycles are issued consecutively within a period of a burst access.

3. The interface according to claim 2, wherein the plurality of command cycles includes two command cycles.

4. The interface according to claim 1, wherein the block address converter shifts the external block address in response to an identification address identifying data transferred in response to the burst access command.

5. The interface according to claim 4, wherein the identification address is input in response to the burst access command and set based on an initial identification address corresponding to data transferred at the first command cycle.

6. The interface according to claim 4, wherein a data area accessed within a block on an external block address basis is unique.

7. The interface according to claim 6, further comprising a bus selector that selects a position of a data line to be used in an input-output bus on an external block address basis when a bit width of data transferred at a command cycle is smaller than a bit width of an input-output bus of the storage device.

8. A memory system, comprising:
   a storage device which includes a plurality of blocks;
   a controller that divides a burst access command, which comprises an external block address and an initial address to be incremented, into a plurality of command cycles, and supplies the plurality of command cycles to the storage device; and
   a block address converter that outputs an address at a first command cycle of the plurality of command cycles, the outputted address being obtained by shifting at least one bit of the external block address input in response to the burst access command,
   wherein the outputted address is supplied to the storage device at the first command cycle, and the external block address is supplied to the storage device at one of the plurality of command cycles other than the first command cycle.

9. An access control method, comprising:
   dividing a burst access command, which comprises an external block address and an initial address to be incremented, into a plurality of command cycles;
   supplying the command cycles to a storage device including a plurality of blocks; and
   supplying an address to the storage device at a first command cycle of the plurality of command cycles, the address being obtained by shifting at least one bit of the external block address input in response to the burst access command, and supplying the external block address to the storage device at one of the plurality of command cycles other than the first command cycle.

* * * * *